United States Patent
Cho et al.

(10) Patent No.: US 9,025,108 B2
(45) Date of Patent: May 5, 2015

(54) DISPLAY APPARATUS

(71) Applicants: Sung Ho Cho, Yongin (KR); Do Hoon Kim, Yongin (KR)

(72) Inventors: Sung Ho Cho, Yongin (KR); Do Hoon Kim, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/911,141

(22) Filed: Jun. 6, 2013

(65) Prior Publication Data
US 2014/0027791 A1 Jan. 30, 2014

(30) Foreign Application Priority Data
Jul. 24, 2012 (KR) .................... 10-2012-0080681

(51) Int. Cl.
*G02F 1/1333* (2006.01)
*H01L 33/44* (2010.01)
*G02F 1/133* (2006.01)

(52) U.S. Cl.
CPC ................ *H01L 33/44* (2013.01); *G02F 1/133* (2013.01)

(58) Field of Classification Search
CPC ............. G02F 1/1339; G02F 1/13392; G02F 1/13394; G02F 1/1341; G02F 2001/13396; G02F 2001/13398; G02F 2001/13415
USPC .................... 349/60, 151, 153, 155, 156, 157
See application file for complete search history.

(56) References Cited

U.S. PATENT DOCUMENTS

| 7,355,669 B2 * | 4/2008 | Onda et al. ..................... 349/156 |
| 2004/0263740 A1 * | 12/2004 | Sakakura et al. ............. 349/138 |
| 2014/0176895 A1 * | 6/2014 | Park, MunGi ................ 349/153 |

FOREIGN PATENT DOCUMENTS

| KR | 10 2005-0034900 A | 4/2005 |
| KR | 10 2006-0040104 A | 5/2006 |
| KR | 10 2007-0014665 A | 2/2007 |

* cited by examiner

*Primary Examiner* — Eva Y Montalvo
*Assistant Examiner* — Samuel Lair
(74) *Attorney, Agent, or Firm* — Lee & Morse, P.C.

(57) ABSTRACT

A display apparatus includes a first substrate having a display area and a non-display area surrounding the display area, an organic film on the first substrate, a first trench in the organic film in the non-display area, the first trench surrounding the display area and including a first sidewall on an inner side of the display apparatus, which includes a sidewall of the organic film, and a second sidewall on an outer side of the display apparatus, which includes a sidewall of the organic film, and a first blocking film containing an inorganic material and covering a surface of the organic film in the non-display area and the sidewall of the organic film included in the first sidewall of the first trench.

21 Claims, 15 Drawing Sheets

DISPLAY APPARATUS

CROSS-REFERENCE TO RELATED APPLICATION

This application claims priority under 35 U.S.C. §119 from Korean Patent Application No. 10-2012-0080681, filed on Jul. 24, 2012, in the Korean Intellectual Property Office, the disclosure of which is incorporated herein by reference in its entirety.

BACKGROUND

1. Field

Example embodiments relate to a display apparatus, and more particularly, to a display apparatus including a liquid crystal layer interposed between display substrates.

2. Description of the Related Art

Liquid crystal displays (LCDs) are applied to various devices including televisions, monitors, notebooks, as well as mobile phones, personal data assistants (PDAs) and smart phones. A LCD includes a first display substrate and a second display substrate which face each other. The first display substrate and the second display substrate are bonded together by a sealing member, e.g., a sealant, and a liquid crystal layer is formed in a space between the first and second display substrates. Wirings or electrodes may be placed on the first and second display substrates, and an organic film may be formed to protect or insulate the wirings and/or electrodes.

SUMMARY

Aspects of example embodiments provide a display apparatus that prevents deterioration of pixels or liquid crystals by inhibiting the penetration of moisture or impurities.

According to an aspect of the example embodiments, there is provided a display apparatus including a first substrate having a display area and a non-display area surrounding the display area, an organic film on the first substrate, a first trench in the organic film in the non-display area, the first trench surrounding the display area and including a first sidewall on an inner side of the display apparatus, which includes a sidewall of the organic film, and a second sidewall on an outer side of the display apparatus, which includes a sidewall of the organic film, and a first blocking film containing an inorganic material and covering a surface of the organic film in the non-display area and the sidewall of the organic film included in the first sidewall of the first trench.

The first blocking film may extend onto a bottom surface of the first trench.

The first blocking film may cover the sidewall of the organic film in the second sidewall of the first trench.

The display apparatus may further include an insulating film between the first substrate and the organic film, the first trench exposing the insulating film, and each of the first sidewall and the second sidewall of the first trench further comprises a sidewall of the insulating film.

The first blocking film may cover the sidewall of the insulating film in the first sidewall of the first trench.

The display apparatus may further include a second substrate separated from the first substrate and facing the first substrate, and a sealing member between the first substrate and the second substrate, the sealing member bonding the first substrate and the second substrate, wherein the sealing member is in the non-display area, the sealing member being between the display area and the first trench.

The first blocking film may cover the organic film between the sealing member and the first trench.

The display apparatus may further include an outer spacer between the first substrate and the second substrate and overlapping the first trench.

The display apparatus may further include an overcoating layer on the second substrate, and an inorganic film on the overcoating layer and at least partially facing the first blocking film.

The inorganic film may be a common electrode.

The inorganic film may be separated from an extended plane from an adjacent sidewall of the second substrate.

The display apparatus may further include a second trench in the organic film, the second trench being in the non-display area and surrounding the display area, wherein the sealing member is between the first and second trenches, and wherein the second trench includes a first sidewall including a sidewall of the organic film, and a second sidewall opposite the first sidewall, the first sidewall being between the second sidewall and the display area and including a sidewall of the organic film.

The first blocking film may be extended to cover the second sidewall of the second trench.

The display apparatus may further include a second blocking film including an inorganic material and covering the second sidewall of the second trench.

The display apparatus may further include an inner spacer between the first substrate and the second substrate and overlapping the second trench.

The first blocking film may include a conductive material.

The display apparatus may further include a pixel electrode on the organic film in the display area, the first blocking film including the same material as the pixel electrode.

The display apparatus may further include a second blocking film physically separated from the first blocking film, the second blocking film including an inorganic material and covering the sidewall of the organic film in the second sidewall of the first trench.

The second blocking film may extend to cover the organic film outside the first trench.

The second blocking film may be separated from an extended plane from an adjacent sidewall of the first substrate.

According to another aspect of the example embodiments, there is provided a display apparatus including a first substrate having a display area and a non-display area, the non-display area surrounding the display area, an organic film on the first substrate, the organic film having an outermost sidewall in the non-display area, and is separated from an extended plane from an adjacent sidewall of the first substrate, and a blocking film including an inorganic material, the blocking film covering a the organic film in the non-display area and the outermost sidewall of the organic film.

The display apparatus may further include a second substrate separated from the first substrate and facing the first substrate, and a sealing member in the non-display area between the first substrate and the second substrate, the sealing member bonding the first substrate and the second substrate, and the sealing member being between the display area and the outermost sidewall of the organic film.

The blocking film may cover the organic film between the sealing member and the outermost sidewall of the organic film.

BRIEF DESCRIPTION OF THE DRAWINGS

The above and other aspects and features of the example embodiments will become more apparent by describing in detail exemplary embodiments thereof with reference to the attached drawings, in which.

DETAILED DESCRIPTION

Advantages and features of example embodiments and methods of accomplishing the same may be understood more readily by reference to the following detailed description and the accompanying drawings. The example embodiments may, however, be embodied in many different forms and should not be construed as being limited to the embodiments set forth herein. Rather, these embodiments are provided so that this disclosure will be thorough and complete and will fully convey the inventive concept to those skilled in the art, and the example embodiments will only be defined by the appended claims.

It will be understood that when an element or layer is referred to as being "on" another element or layer, the element or layer can be directly on another element or layer or intervening elements or layers may be present. Like numbers refer to like elements throughout.

It will be understood that, although the terms first, second, third, etc., may be used herein to describe various components, these components should not be limited by these terms. These terms are only used to distinguish one component from another component. Thus, a first component discussed below could be termed a second component without departing from the teachings of the example embodiments.

A liquid crystal display (LCD) will hereinafter be described as an example of a display apparatus. However, the display apparatus according to the example embodiments is not limited to the LCD. Other display apparatuses, e.g., an organic light-emitting diode (OLED) display and a plasma display panel (PDP), are also applicable without departing from the spirit of the example embodiments.

Figure 1:
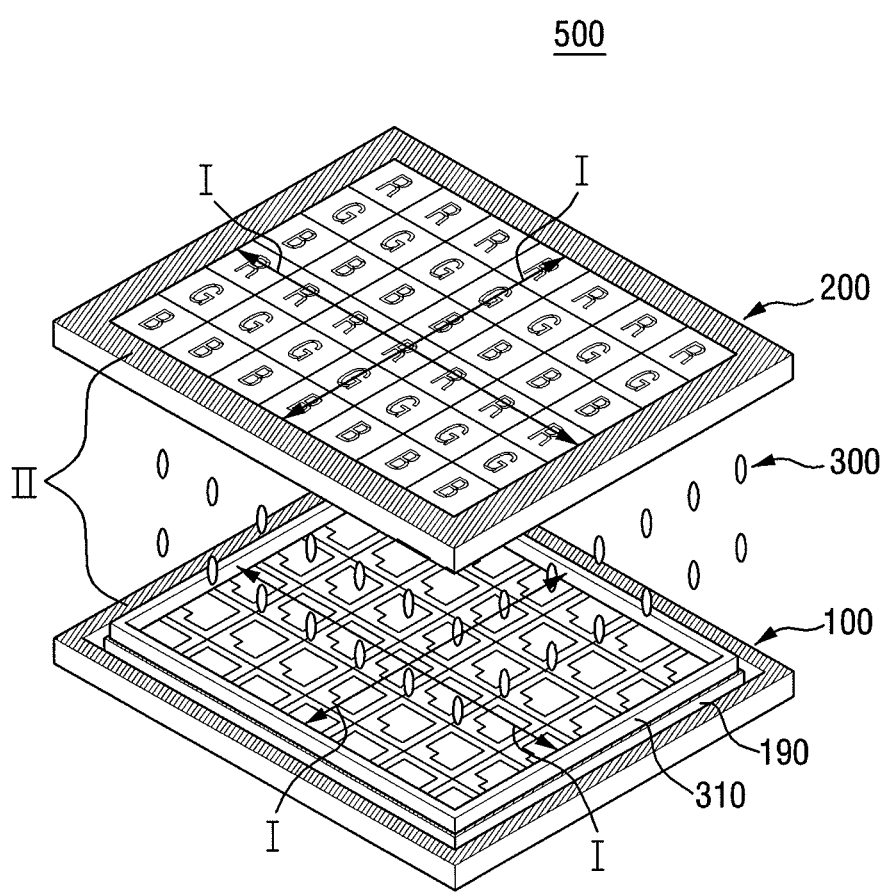
FIG. 1 is a schematic exploded perspective view of a display apparatus according to an embodiment.
Figure 2:
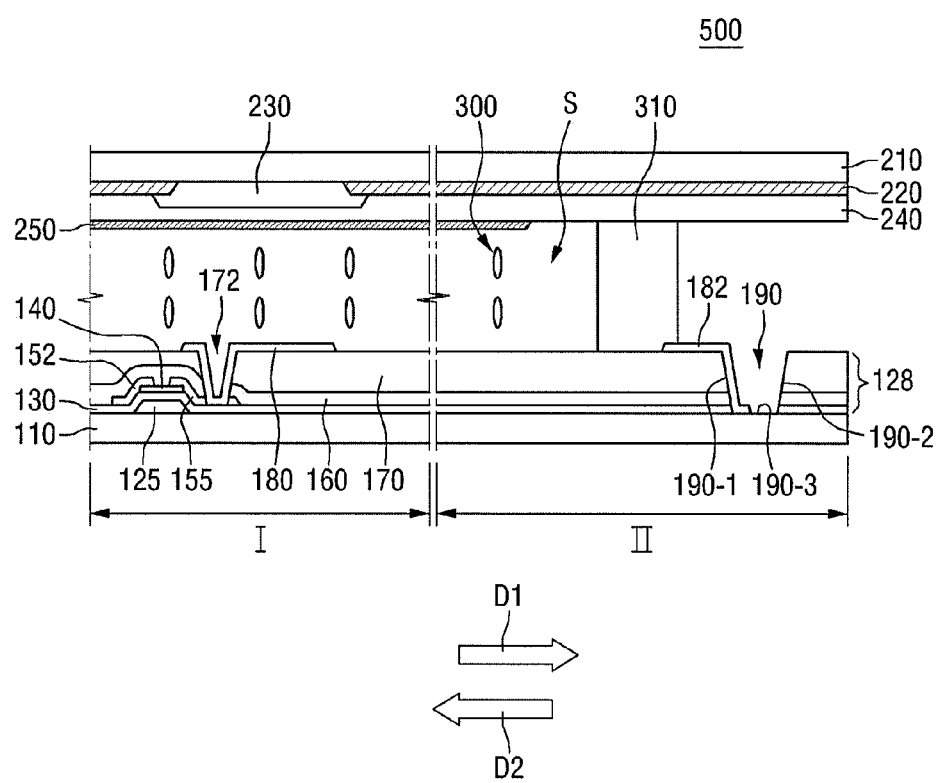
FIG. 2 is a cross-sectional view of the display apparatus shown in FIG. 1.
Figure 3:
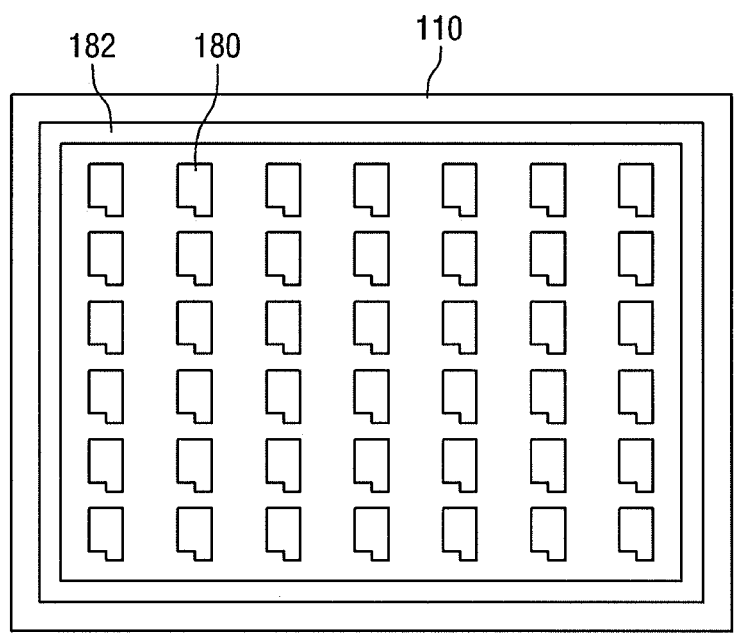
FIG. 3 is a layout view showing the position of a blocking film in a first display substrate of the display apparatus shown in FIG. 1.

FIG. 1 is a schematic exploded perspective view of a display apparatus 500 according to an embodiment. FIG. 2 is a cross-sectional view of the display apparatus 500. FIG. 3 is a layout view of a blocking film 182 in the display apparatus 500.

Referring to FIGS. 1 through 3, the display apparatus 500 may include a first display substrate 100, a second display substrate 200 separated from the first display substrate 100 and faces the first display substrate 100, and a liquid crystal layer 300 between the first display substrate 100 and the second display substrate 200. Each of the first and second display substrates 100 and 200 includes a display area I and a non-display area II. A plurality of pixels arranged in a matrix may be defined in the display area I.

In the display area I of the first display substrate 100, a plurality of gate lines extending in a first direction and a plurality of data lines extending in a second direction perpendicular to the first direction may be formed. A pixel electrode 180 may be disposed in each of the pixels defined by the gate lines and the data lines, respectively. The pixel electrode 180 may receive a data voltage via a thin-film transistor (TFT) which is a switching device. A gate electrode 125 which is a control terminal of the TFT may be connected to a gate line, a source electrode 152 which is an input terminal of the TFT may be connected to a data line, and a drain electrode 155 which is an output terminal of the TFT may be connected to the pixel electrode 180 by a contact. A channel of the TFT may be formed by a semiconductor layer 140. The semiconductor layer 140 may overlap the gate electrode 125. The source electrode 152 and the drain electrode 155 may be separated from each other with respect to the semiconductor layer 140. The pixel electrode 180 generates an electric field together with a common electrode 250, thereby controlling an alignment direction of liquid crystal molecules of the liquid crystal layer 300 interposed between the pixel electrode 180 and the common electrode 250.

The non-display area II may be an area located around the display area I to surround the display area I. A driver may be disposed in the non-display area II of the first display substrate 100. The driver may provide a gate driving signal, a data driving signal, etc. to each pixel in the display area I.

In the display area I of the second display substrate 200, a color filter 230 may be formed in each pixel. The color filters 230 may include red, green and blue filters 230. The red, green and blue filters 230 may be arranged alternately. A light-blocking pattern 220 may be disposed at a boundary between every two color filters 230. The light-blocking pattern 220 may also be disposed in the non-display area II of the second display substrate 200. The light-blocking pattern 220 in the non-display area II may be wider than the light-blocking pattern 220 formed at the boundary between every two color filters 230. The common electrode 250 formed as a single piece may be disposed on the whole surface in the display area I, regardless of the pixels.

The first display substrate 100 and the second display substrate 200 may be bonded together by a sealing member 310 such as a sealant. The sealing member 310 may be located on the periphery of the first display substrate 100 and the second display substrate 200, that is, on the non-display area II. Accordingly, a sealed region S may be defined by the substrates 100, 200 and the sealing member 310.

The display apparatus 500 will now be described in greater detail with respect to FIG. 2.

The first display substrate 100 may use a first substrate 110 as a base substrate. The first substrate 110 may include the display area I and the non-display area II. The first substrate 110 may be a transparent insulating substrate, e.g., made of glass or transparent plastic.

The gate lines made of a conductive material and the gate electrode 125 protruding from each of the gate lines are formed on the first substrate 110 in the display area I. Although not shown in the drawings, the gate lines may extend up to the non-display area II, and gate pads may be formed in the non-display area II. Each of the gate lines and the gate electrode 125 are covered with a gate insulating film 130. The gate insulating film 130 is formed up to the non-display area II.

The semiconductor layer 140 and an ohmic contact layer (not shown) may be formed on the gate insulating film 130 in the display area I. The source electrode 152 which branches from each data line and the drain electrode 155 which is separated from the source electrode 152 may be formed on the semiconductor layer 140 and the ohmic contact layer. Although not shown in the drawings, the data lines may extend up to the non-display area II, and data pads may be formed in the non-display area II.

A passivation film 160 may be formed on the source electrode 152 and the drain electrode 155. The passivation film 160 may be a type of an insulating film made of an insulating material, e.g., a silicon nitride film, a silicon oxide film, or a silicon oxynitride film.

An organic film 170 made of an organic material may be disposed on the passivation film 160. The passivation film 160 and the organic film 170 may be formed up to the non-display area II, e.g., each of the passivation film 160 and the organic film 170 may extend to overlap the display area I and the non-display area II. The passivation film 160 is optional.

In each pixel, the pixel electrode 180 made of a conductive material may be disposed on the organic film 170 in the display area I. The pixel electrode 180 may be electrically connected to the drain electrode 155 by a contact hole 172 which penetrates the organic film 170 and the passivation film 160 to expose the drain electrode 155. The pixel electrode 180 may be made of, e.g., indium tin oxide, indium zinc oxide, indium oxide, zinc oxide, tin oxide, gallium oxide, titanium oxide, aluminum, silver, platinum, chrome, molybdenum, tantalum, niobium, zinc, magnesium, an alloy of these materials, or a stack of these materials.

A blocking film 182 may be formed on the organic film 170 in the non-display area II. In addition, a trench 190 may penetrate the organic film 170, the passivation film 160, and the gate insulating film 130 in the non-display area II. The blocking film 182 may extend into the trench 190. This will be described in more detail later.

The second display substrate 200 uses a second substrate 210 as a base substrate. The second substrate 210 may be a transparent insulating substrate, e.g., made of glass or transparent plastic.

The light-blocking pattern 220 is formed on the second substrate 210. The light-blocking pattern 220 may be formed up to the non-display area II. The color filters 230 may be formed on the light-blocking pattern 220 in the display area I.

An overcoating layer 240 may be formed on the color filters 230 and the light-blocking pattern 220. The overcoating layer 240 may be formed up to the non-display area II.

The common electrode 250 may be disposed on the overcoating layer 240. The common electrode 250 may be made of, e.g., indium tin oxide, indium zinc oxide, indium oxide, zinc oxide, tin oxide, gallium oxide, titanium oxide, aluminum, silver, platinum, chrome, molybdenum, tantalum, niobium, zinc, magnesium, an alloy of these materials, or a stack of these materials.

The common electrode 250 may cover the entire display area I. However, the common electrode 250 may also include slits or apertures within the display area I. While the common electrode 250 is formed only partially in the non-display area II, e.g., the common electrode 250 extends into the non-display area II to overlap only a small portion between the display area I and the sealing member 310, it may not be formed on the periphery of the second display substrate 200. In other words, the common electrode 250 may not overlap the periphery of the second display substrate 200, e.g., the common electrode 250 may not extend beyond the sealing member 310, thereby exposing the overcoating layer 240 in the non-display area II.

The first display substrate 100 and the second display substrate 200 face each other with a predetermined cell gap maintained therebetween. The liquid crystal layer 300 may be interposed between the first display substrate 100 and the second display substrate 200 in the display area I. Although not shown in the drawings, an alignment film may be formed on at least one of a surface of the first display substrate 100 and a surface of the display substrate 200 which contact the liquid crystal layer 300. The pixel electrode 180 of the first display substrate 100 and the common electrode 250 of the second display substrate 200 may be placed to face each other. Thus, the pixel electrode 180 and the common electrode 250 can form an electric field in the liquid crystal layer 300.

The sealing member 310 such as a sealant is disposed in the non-display area II of the display apparatus 500. The sealing member 310 is formed around the display area I to surround the display area I. Therefore, the sealing member 310 not only bonds the first display substrate 100 and the second display substrate 200 together but also defines a space between them. Since the liquid crystal layer 300 is formed within the defined space, the outflow of liquid crystal molecules can be prevented.

The trench 190 formed in the first display substrate 100 in the non-display area II may be disposed outside the sealing member 310. In the first display substrate 100 in the non-display area II, the first substrate 110, the gate insulating film 130, the passivation film 160 and the organic film 170 may be formed sequentially, and the trench 190 may penetrate the organic film 170, the passivation film 160, and the gate insulating film 130 to expose a surface of the first substrate 110. Like the sealing member 310, the trench 190 may surround the display area I and may be formed on an outer side of the display apparatus 500 with respect to the sealing member 310, e.g., the trench 190 may spaced apart from the sealing member 310 along a direction D1 (see arrow in FIG. 2). It is noted that the direction D1 is orientated away from a center of the display apparatus 500.

In the present specification, a stack of films, e.g., a stack of the gate insulating film 130, the passivation film 160, and the organic film 170, defining an exposed sidewall of the trench 190 in the non-display area II is referred to as an edge pattern 128. In other words, the edge pattern 128 is on an outer side of the trench 190, i.e., the edge pattern 128 is oriented along the direction D1 relative to the trench 190. The edge pattern 128 may be formed along outermost edges of the display apparatus 500.

The trench 190 may include a bottom surface 190_3 and sidewalls 190_1 and 190_2. The bottom surface 190_3 of the trench 190 may include the surface of the first substrate 110, and the sidewalls 190_1 and 190_2 of the trench 190 may include sidewalls of the organic film 170, sidewalls of the passivation film 160, and sidewalls of the gate insulating film 130. The sidewalls 190_1 and 190_2 of the trench 190 may include a first sidewall 190_1 and a second sidewall 1902. A distance between the first sidewall 190_1 and the sealing member 310 may be smaller than a distance between the second sidewall 190_2 and the sealing member 310. In other words, the second sidewall 190_2 may be the exposed sidewall defining the edge pattern 128. While the second sidewall 190_2 may be oriented along the direction D1 relative to a center of the trench 190, the first sidewall 190_1 may be oriented along a direction D2, i.e., a direction oriented toward a center of the display apparatus 500, relative to the center of the trench 190.

The blocking film 182 is formed near the trench 190 and partially overlaps the trench 190. That is, the blocking film 182 may overlap an upper surface of the organic film 170 in the non-display area II and may extend along the first sidewall 190_1 of the trench 190 toward the bottom 190_3 of the trench 190. Accordingly, like the trench 190, the blocking film 182 may surround the display area I, as shown in FIG. 3.

In detail, the blocking film 182 is formed on the organic film 170 in a region oriented along the direction D2 relative to the trench 190. The blocking film 182 extends from the organic film 170 into the trench 190 to cover at least the first sidewall 190_1 of the trench 190. In FIG. 3, the blocking film 182 extends up to, e.g., to contact, the bottom surface 190_3 via the first sidewall 190_1. The blocking film 182 formed on the organic film 170 may extend up to, e.g., to contact, a region where the sealing member 310 is formed. In some embodiments, the blocking film 182 may contact the sealing member 310. In some other embodiments, the blocking film 182 may extend along the direction D2 to overlap at least part of the sealing member 310.

The blocking film 182 may be made of an inorganic material. Together with the trench 190, the blocking film 182 made of the inorganic material prevents the penetration of moisture or impurities into the display area I through the organic film 170.

In general, films located at edges of a display apparatus, e.g., the periphery of the non-display area II including the edge pattern 128 of the display apparatus 500, may be easily exposed to moisture or impurities. In particular, the organic film 170, i.e., which is made of an organic material that is susceptible to moisture penetration, may be easily exposed to moisture or impurities.

However, as the edge pattern 128 according to example embodiments is spatially separated from the display area I by the trench 190, the trench 190 can inhibit penetration of moisture or impurities. That is, even if moisture or impurities are introduced into the edge pattern 128, the trench 190 may inhibit penetration of moisture or impurities into the display area I of the display apparatus 500. Further, even if moisture or impurities were to be introduced into the trench 190, the blocking film 182 on the first sidewall 190_1 of the trench 190 can effectively prevent moisture or impurities from penetrating into a portion of the organic film 170 in the display area I. In other words, since the blocking film 182 covers a surface of the organic film 170, i.e., a top surface of the organic film 170 facing the overcoating layer 240 and a side surface of the organic film 170 facing the inside of the trench 190, penetration of moisture or impurities through the surface of the organic film 170 can be prevented. That is, top and side surfaces of the organic film 170 beyond the sealing member 130, i.e., surfaces of the organic film 170 outside the sealed region S, are all coated with the blocking film 182, and a bottom surface of the organic film 170 is covered with the passivation film 160. Therefore, moisture or impurities cannot penetrate into the organic film 170.

Since penetration of moisture or impurities into the sealed region S of the display apparatus 500 is inhibited, deterioration of pixels or liquid crystals can be prevented. Accordingly, this improves the stability and reliability of display quality.

In some embodiments, the blocking film 182 may be made of an inorganic conductive material. Examples of the inorganic conductive material may include indium tin oxide, indium zinc oxide, indium oxide, zinc oxide, tin oxide, gallium oxide, titanium oxide, aluminum, silver, platinum, chrome, molybdenum, tantalum, niobium, zinc, magnesium, and alloys of these materials. The blocking film 182 may be made of a stack of two or more of the above materials.

When the blocking film 182 is made of the inorganic conductive material, an electric field may be applied to the blocking film 182. In an exemplary embodiment, a common voltage may be applied to the blocking film 182. When the common voltage is applied to the blocking film 182, ionic impurities may be trapped in the blocking film 182. Thus, penetration of moisture or impurities can further be inhibited. Since the penetration of moisture or impurities into the sealed region S of the display apparatus 500 is further inhibited, the stability and reliability of display quality can further be improved.

Although not shown in the drawings, wirings or electrodes disposed on the first display substrate 100 or the second display substrate 200 may be electrically connected to the blocking film 182 in order to apply an electric field to the blocking film 182. In an exemplary embodiment, the electric field applying wiring may be a common voltage wiring for applying the common voltage from the first display substrate 100 to the second display substrate 200 or a sustain electrode wiring formed on the first display substrate 100.

In some embodiments, the blocking film 182 may be made of the same material as the pixel electrode 180. Further, the blocking film 182 and the pixel electrode 180 may be formed simultaneously by the same process. Referring to FIG. 2, in an exemplary method of fabricating the blocking film 182, the organic film 170 is formed on the first substrate 110, and an etch mask exposing a region for forming a contact hole and a region for forming a trench is formed on the organic film 170. Then, the organic film 170 and the passivation film 160 in the exposed regions are etched. As a result, the drain electrode 155 is exposed in the region for forming a contact hole, and the gate insulating film 130 is exposed in the region for forming a trench. The gate insulating film 130 is etched using an etchant having a higher etch rate for the gate insulating film 130 than for the drain electrode 155, thereby completing the trench 190. Finally, an indium tin oxide film is stacked on the above structure and then patterned to form the pixel electrode 180 and the blocking film 182 simultaneously.

Hereinafter, other embodiments will be described. In the following embodiments, a description of elements substantially identical to those of the previous embodiment described above will be omitted or simplified.

Figure 4:
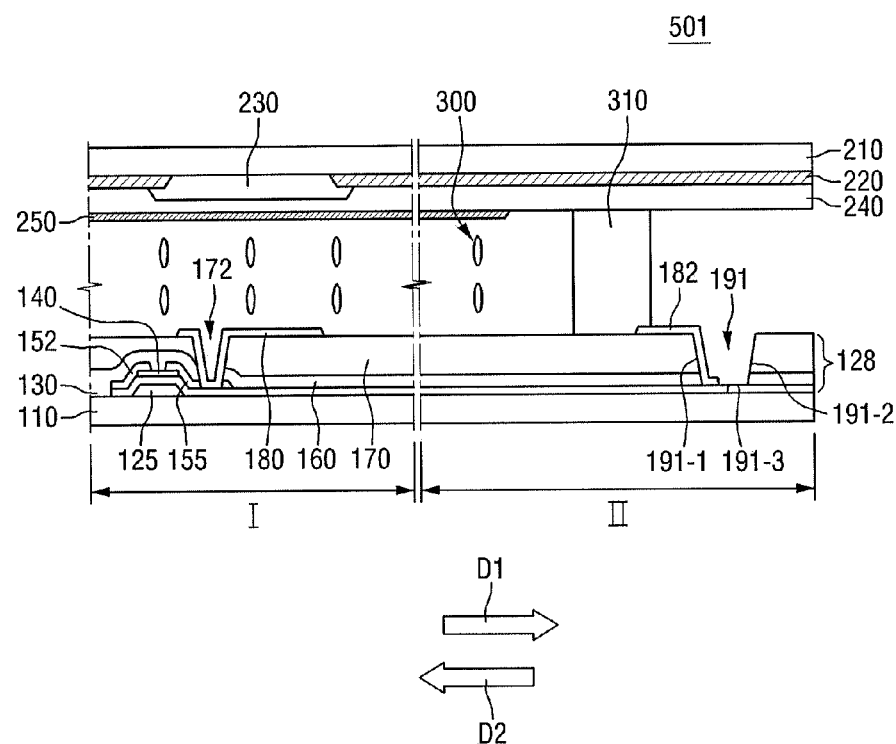
FIG. 4 is a cross-sectional view of a display apparatus according to another embodiment.

FIG. 4 is a cross-sectional view of a display apparatus 501 according to another embodiment. Referring to FIG. 4, the display apparatus 501 according to the current embodiment is different from the embodiment of FIG. 2 in the position of a bottom surface 191_3 of a trench 191. That is, the trench 191 according to the current embodiment penetrates an organic film 170 and a passivation film 160 to expose a surface of a gate insulating film 130. Therefore, the bottom surface 191_3 of the trench 191 may include the surface of the gate insulating film 130, and first and second sidewalls 191_1 and 191_2 of the trench 191 may include sidewalls of the organic film 170 and sidewalls of the passivation film 160.

While the blocking film 182 extends up to the bottom surface 191_3 via the first sidewall 191_1 of the trench 191, as described previously with reference to FIG. 2, the blocking film 182 contacts the gate insulating film 130 on the bottom surface 191_3, unlike in FIG. 2. In the current embodiment, the organic film 170 is also protected by the blocking film 182 which covers a surface of the organic film 170 and the first sidewall 191_1 of the trench 191. Therefore, effects substantially similar to the effects obtained in the embodiment of FIG. 2 can be obtained.

Although not shown in the drawing, as another embodiment of the example embodiments, a trench may penetrate the organic film 170 only. In this case, sidewalls of the trench may include only sidewalls of the organic film 170, and a bottom surface of the trench may include the passivation film 160. As the organic film 170 is still protected by the blocking film 182, which covers a surface of the organic film 170 and a first sidewall of the trench, effects substantially similar to the effects obtained in the embodiment of FIG. 2 can be obtained.

Figure 5:
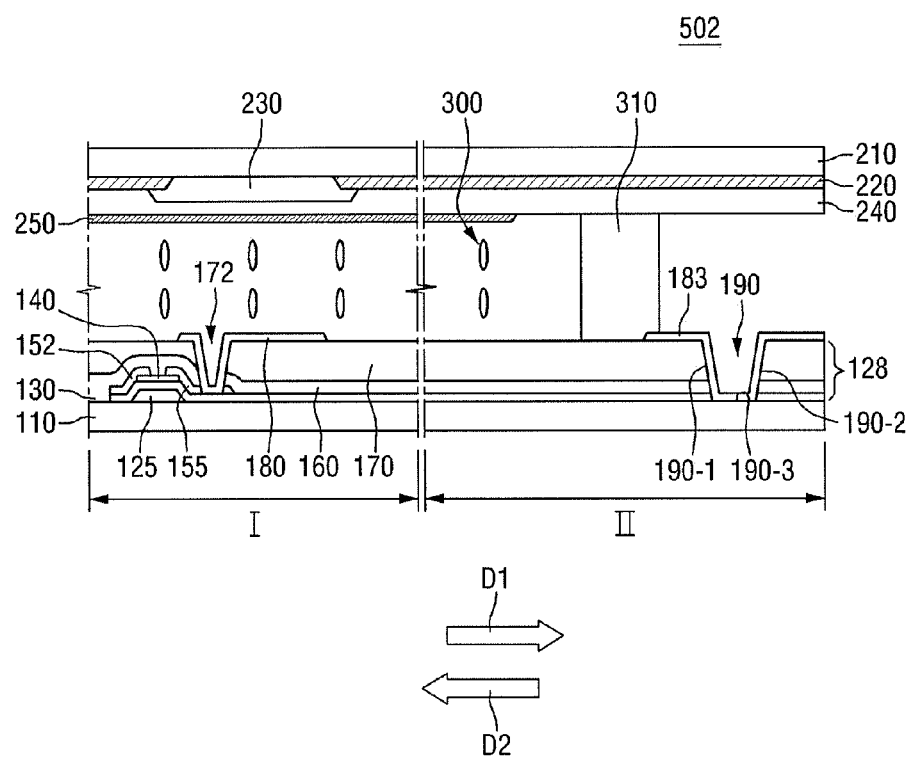
FIGS. 5 through 15 are cross-sectional views of display apparatuses according to other embodiments.

FIG. 5 is a cross-sectional view of a display apparatus 502 according to another embodiment. The display apparatus 502 according to the current embodiment is different from the embodiment of FIG. 2 in that a blocking film 183 is formed not only on the first sidewall 190_1 of the trench 190 but also on the entire bottom surface 190_3 and the second sidewall 190_2 and extends onto an organic film 170 of the edge pattern 128 to be aligned with an extended plane from an adjacent sidewall (i.e., an outermost edge) of the first substrate 110.

In the current embodiment, the blocking film 183 completely covers the second sidewall 190_2 of the trench 190 and a surface of the organic film 170 of the edge pattern 128. Thus, penetration of moisture or impurities from the edge pattern 128 toward the trench 190 can further be inhibited. Since the penetration of moisture or impurities into the sealed region S of the display apparatus 502 is further inhibited, the stability and reliability of display quality can further be improved.

Figure 6:
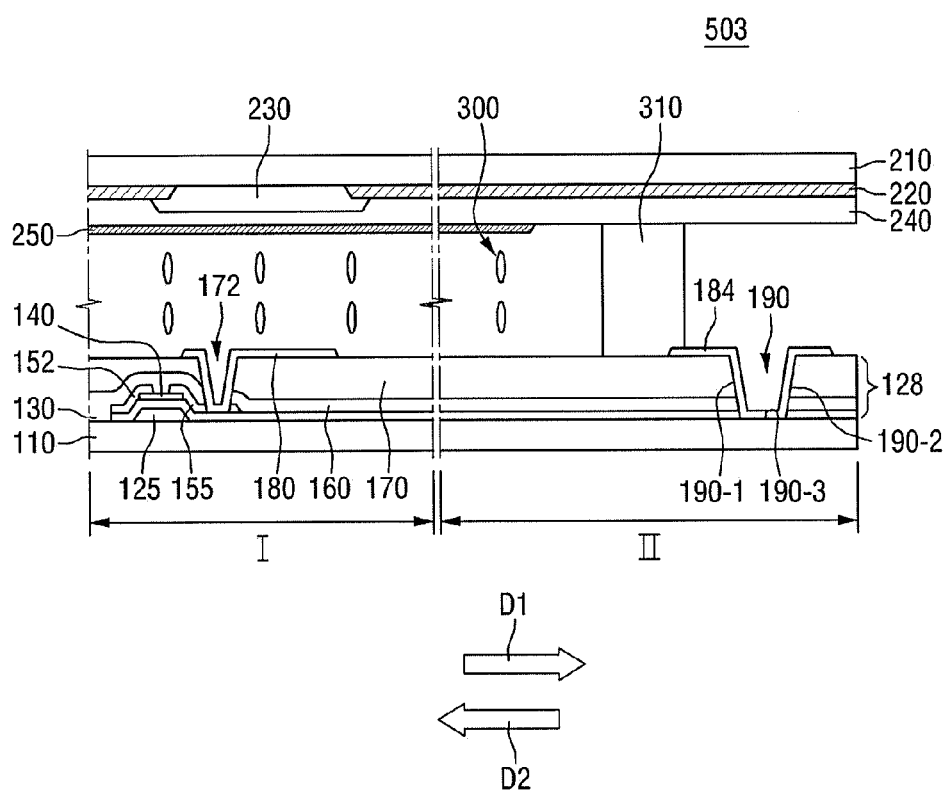

FIG. 6 is a cross-sectional view of a display apparatus 503 according to another embodiment. Referring to FIG. 6, the display apparatus 503 according to the current embodiment is substantially the same as the embodiment of FIG. 5, with the exception of having a blocking film 184 extend to cover completely surfaces of the trench 190 without extending up to an extended plane from an adjacent sidewall (i.e., an outermost edge) of a first substrate 110. In other words, the blocking film 184 is separated from the outermost edge.

In some embodiments, the display apparatus 503 may be fabricated by simultaneously forming a plurality of display apparatuses on a mother substrate and cutting the mother substrate. In this case, devices located on outermost edges of the display apparatus 503 can be damaged by the impact of the cutting. However, if the blocking film 184 is separated from the outermost edges of the display apparatus 503, as in the current embodiment, the damage to the devices by the cutting may be prevented.

Figure 7:
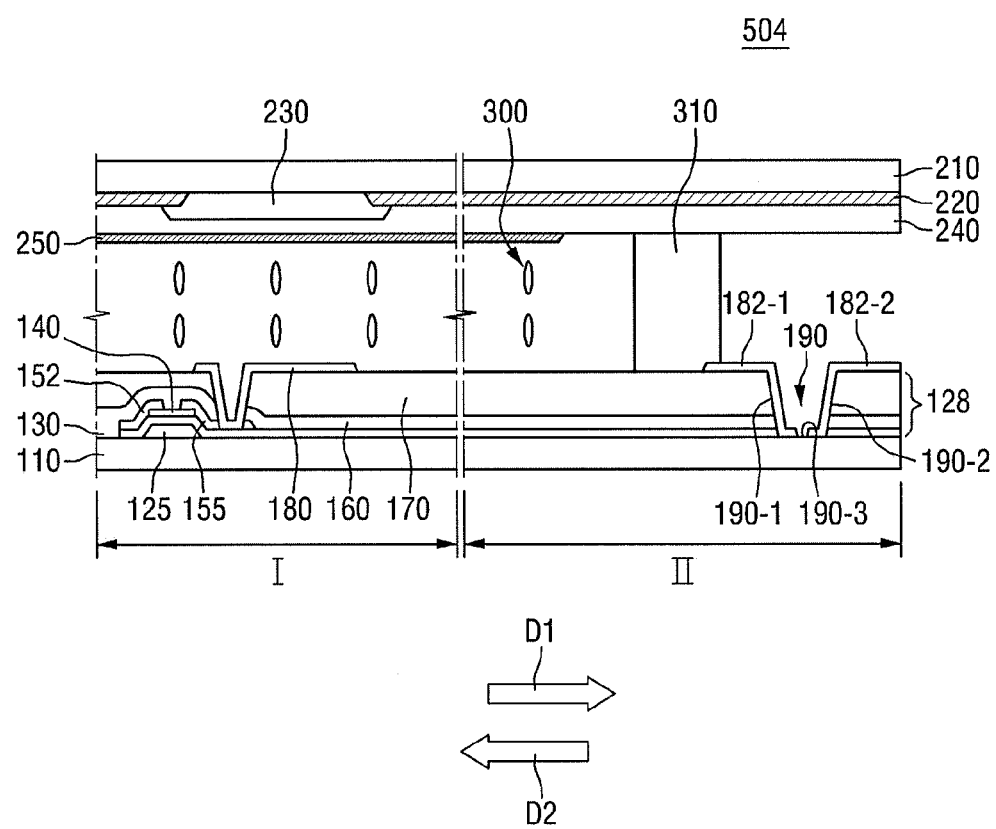

FIG. 7 is a cross-sectional view of a display apparatus 504 according to another embodiment. The display apparatus 504 according to the current embodiment is different from the embodiment of FIG. 2 in that a blocking film includes a first blocking film 182_1 and a second blocking film 182_2. The first blocking film 182_1 has substantially the same configuration as the blocking film 182 of FIG. 2.

The second blocking film 182_2 may be made of an inorganic material. In some embodiments, the second blocking film 182_2 may be made of the same material as the first blocking film 182_1. Further, the second blocking film 182_2 may be formed at the same time as the first blocking film 182_1.

The second blocking film 182_2 covers a top surface of an organic film 170 of the edge pattern 128 and covers the second sidewall 190_2 of the trench 190. The second blocking film 182_2 may extend up to part of the bottom surface 190_3 of the trench 190 but may be separated from the first blocking film 182_1. Accordingly, even if the first blocking film 182_1 and the second blocking film 182_2 are made of an inorganic conductive material, an electrical short circuit between them can be prevented.

In the current embodiment, the second blocking film 182_2 may be aligned with an extended plane from an adjacent sidewall of the first substrate 110 which is an outermost edge of the display apparatus 504. Therefore, even if the second blocking film 182_2 is damaged, e.g., during cutting of the mother substrate, since the second blocking film 182_2 is separated and electrically insulated from the first blocking film 182_1 as described above, the impact of the cutting is not transferred to the first blocking film 182_1. Therefore, the reliability of the first blocking film 182_1 in blocking moisture or impurities can be maintained.

Figure 8:
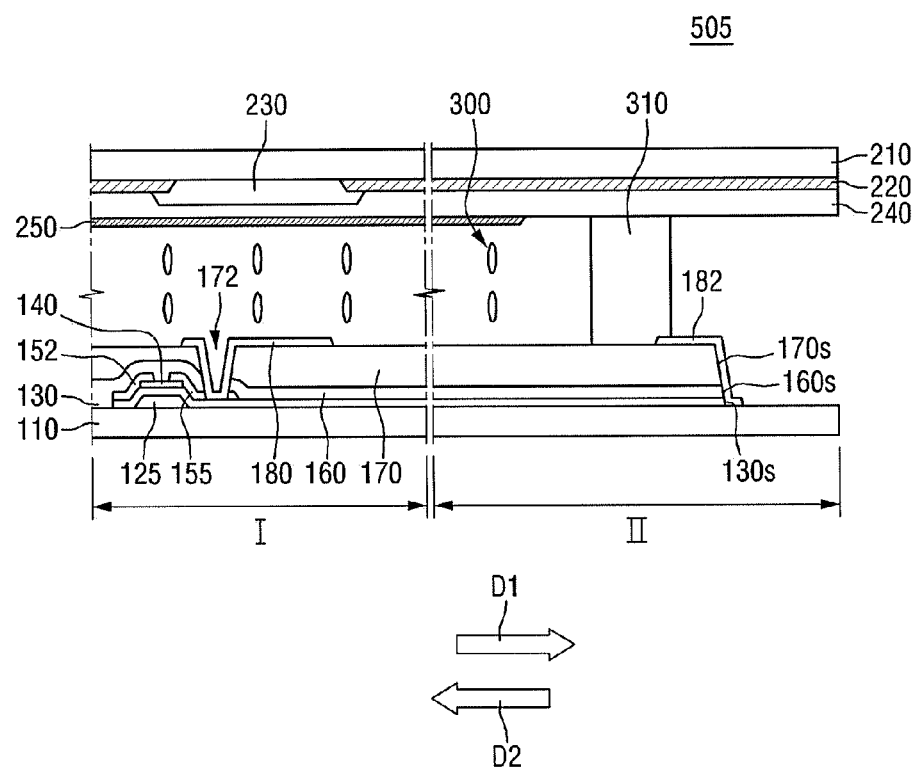

FIG. 8 is a cross-sectional view of a display apparatus 505 according to another embodiment. In the current embodiment, the edge pattern 128 of FIG. 2 is removed.

More specifically, in the display apparatus 505 according to the current embodiment, an outermost sidewall 170s of an organic film 170 is located outside the sealing member 310. The outermost sidewall 170s of the organic film 170 may surround a display area I. The outermost sidewall 170s of the organic film 170 may be separated from an outermost edge which may be defined as an extension line of a sidewall of a first substrate 110. A surface of the organic film 170 outside the sealing member 310 and the outermost sidewall 170s of the organic film 170 are covered with a blocking film 182.

In some embodiments, the outermost sidewall 170s of the organic film 170 may be aligned with an outermost sidewall 160s of a passivation film 160 and an outermost sidewall 130s of a gate insulating film 130. In this case, the blocking film 182 may cover both the outermost sidewall 160s of the passivation film 160 and the outermost sidewall 130s of the gate insulating film 130 and may extend up to a surface of the first substrate 110 which is exposed outside the outermost sidewall 130s of the gate insulating film 130. While the blocking film 182 extends up to the surface of the first substrate 110, it may not extend up to the sidewall of the first substrate 110 but may be separated from the sidewall of the first substrate 110.

In the current embodiment, since the surface of the organic film 170 outside the sealing member 310 and the outermost sidewall 170s of the organic film 170 are covered with the blocking film 182, the penetration of moisture or impurities into the display area I through the organic film 170 can be prevented.

Figure 9:
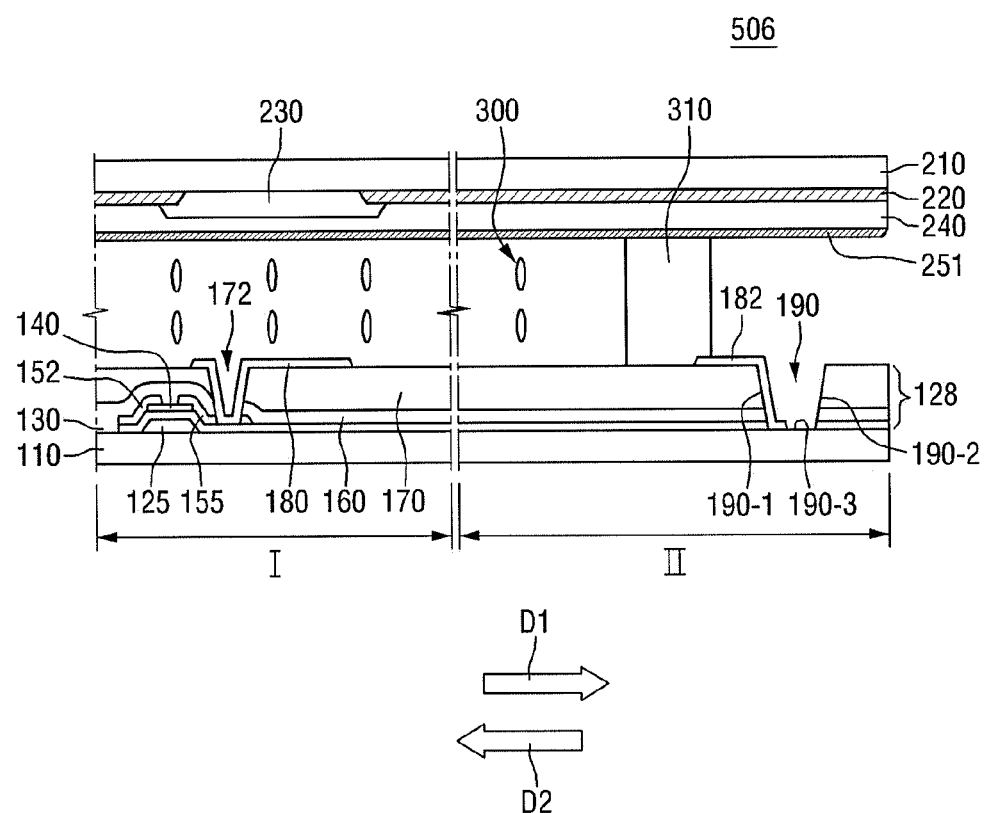

FIG. 9 is a cross-sectional view of a display apparatus 506 according to another embodiment. Referring to FIG. 9, the display apparatus 506 according to the current embodiment is different from the embodiment of FIG. 2 in that a common electrode 251 extends beyond the sealing member 310 along the direction D1 to be aligned with a sidewall of a second substrate 210. At least part of the common electrode 251 faces a blocking film 182.

The common electrode 251 may be made of an inorganic material to prevent the penetration of moisture or impurities into an overcoating layer 240. In addition, when a common voltage is applied to the common electrode 251, ionic impurities may be trapped in the common electrode 251. Accordingly, the penetration of moisture or impurities can further be inhibited.

Figure 10:
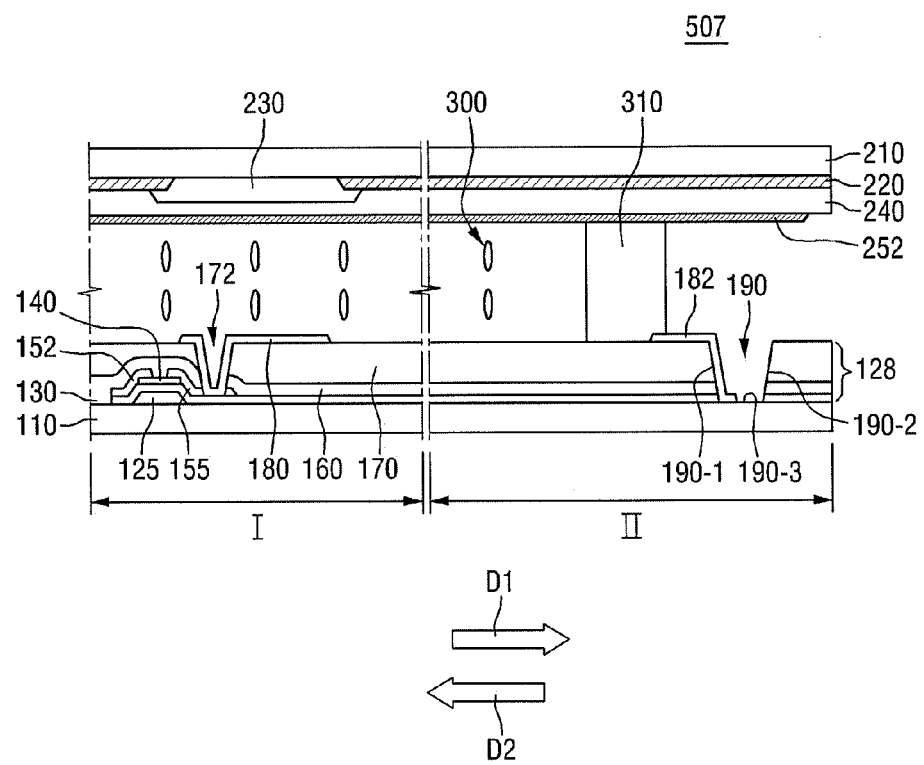

FIG. 10 is a cross-sectional view of a display apparatus 507 according to another embodiment. Referring to FIG. 10, the display apparatus 507 according to the current embodiment is substantially the same as that of FIG. 9, with the exception that a common electrode 252 does not extend up to an extended plane from an adjacent sidewall (i.e., an outermost edge) of a second substrate 210. In other words, the common electrode 252 extends beyond the sealing member 310 along the direction D1 but is separated from the extension surface. This structure is advantageous in preventing damage to the common electrode 252, e.g., by the impact of cutting.

Figure 11:
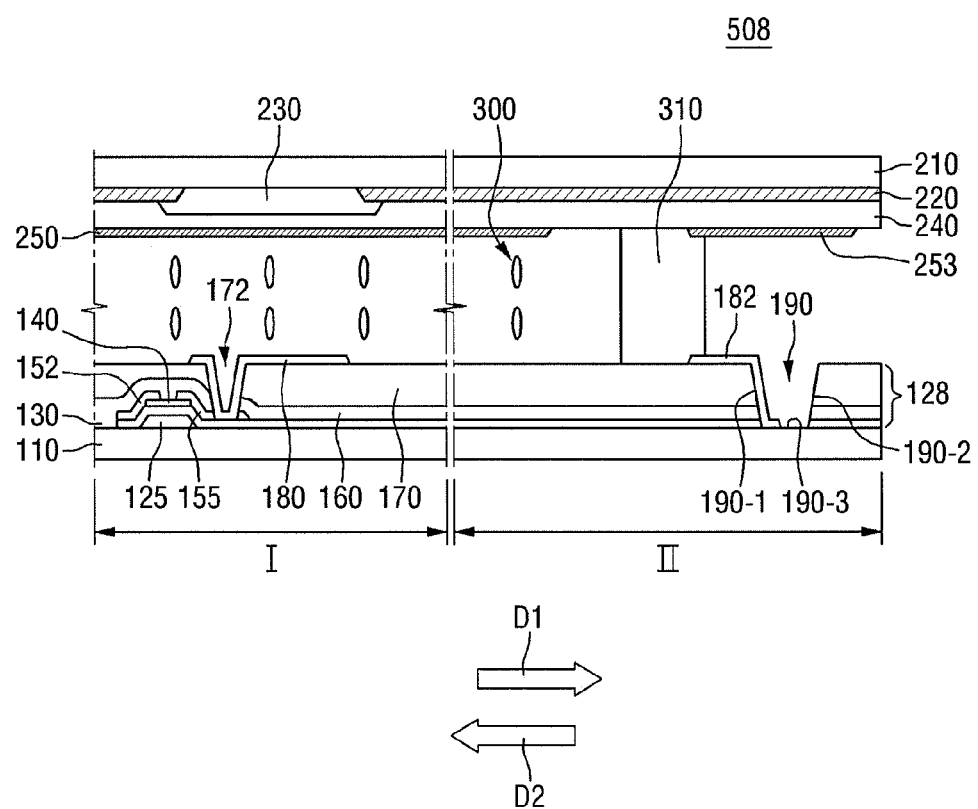

FIG. 11 is a cross-sectional view of a display apparatus 508 according to another embodiment. Referring to FIG. 11, the display apparatus 508 according to the current embodiment is different from the embodiment of FIG. 2 in that an inorganic film 253 made of an inorganic material is formed adjacent to the sealing member 310, i.e. oriented along the direction D1 relatively to the sealing member 310.

In detail, the inorganic film 253 may be formed on the overcoating layer 240 and may at least partially face the blocking film 182. In some embodiments, the inorganic film 253 may be made of substantially the same material as the common electrode 250. However, the inorganic film 253 may be physically separated from the common electrode 250. The inorganic film 253 may contact the sealing member 310 or overlap part of the sealing member 310 of the display apparatus 508. In the drawing, the inorganic film 253 is separated from a sidewall of the second substrate 210 which is an outermost edge of the display apparatus 508. However, the inorganic film 253 may also extend to be aligned with the sidewall of the second substrate 210.

Since the inorganic film 253 covers the overcoating layer 240 outside the sealing member 310, it can prevent the penetration of moisture or impurities into the overcoating layer 240. In addition, a common voltage may be applied to the inorganic film 253 made of a conductive material as well as to the common electrode 250. In this case, ionic impurities may be trapped in the inorganic film 253 as well as in the common electrode 250. Accordingly, the penetration of moisture or impurities can further be inhibited.

Figure 12:
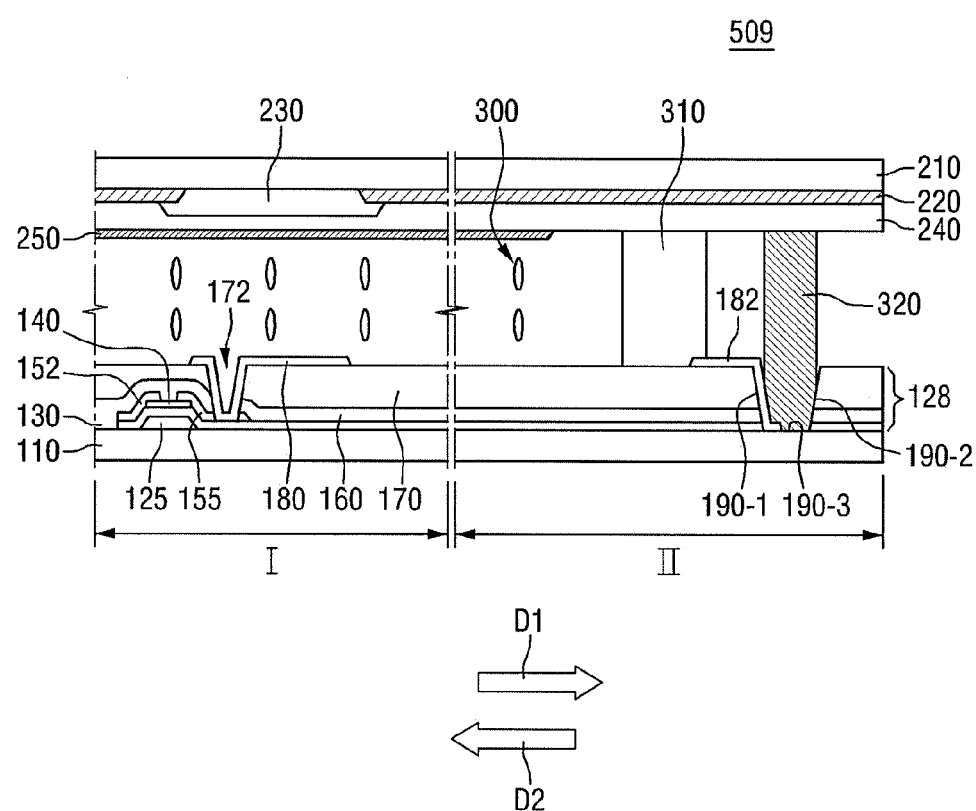

FIG. 12 is a cross-sectional view of a display apparatus 509 according to another embodiment. Referring to FIG. 12, the display apparatus 509 may further include an outer spacer 320 which overlaps the trench 190, e.g., the outer spacer 3 may be formed inside the trench 190 to contact the bottom surface of the trench 190. The outer spacer 320 may contact facing surfaces of first and second display substrates 100 and 200 and maintain a cell gap between the first and second display substrates 100 and 200. In an exemplary embodiment, after being formed on the second display substrate 200, the outer spacer 320 may be brought into physical contact with the first display substrate 100 by compression. The opposite case is also possible.

In some embodiments, the outer spacer 320 may surround the display area I. The outer spacer 320 may be fully accommodated in the trench 190 of the first display substrate 100. The outer spacer 320 may be made of, e.g., epoxy acrylate resin, polyester acrylate resin, urethane acrylate resin, polybutadine acrylate resin, silicon acrylate resin, alkyl acrylate resin, or the like.

The outer spacer 320 may block the introduction of moisture or impurities from the outside. Therefore, the outer spacer 320 can further prevent the penetration of moisture or impurities into the display area I.

Figure 13:
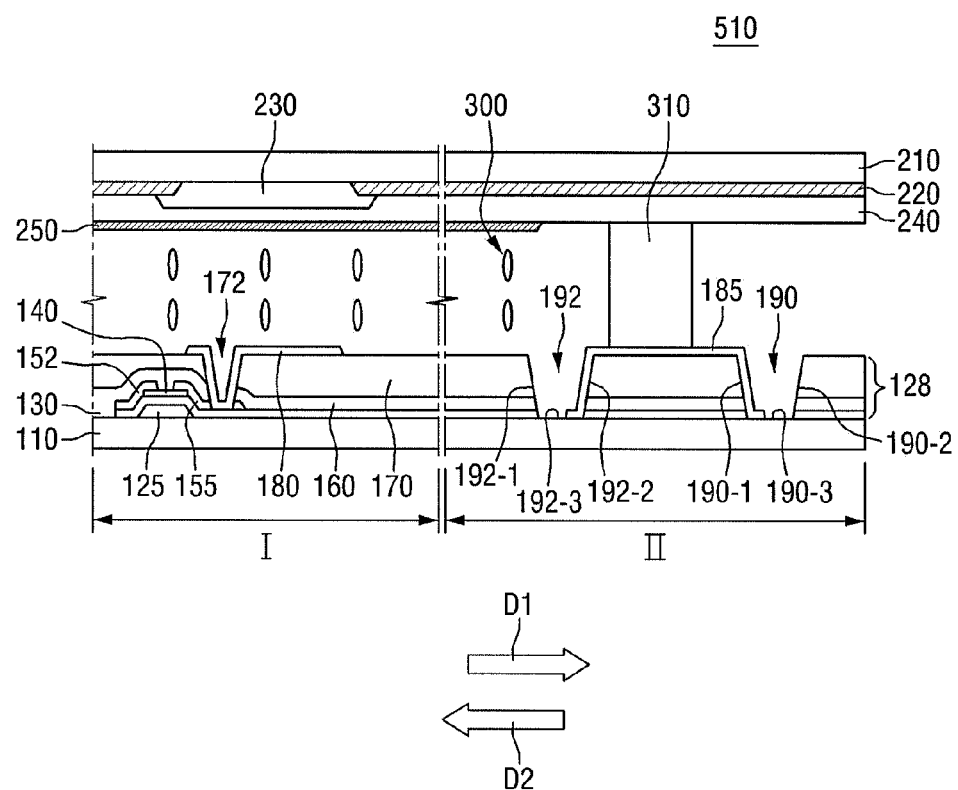

FIG. 13 is a cross-sectional view of a display apparatus 510 according to another embodiment. Referring to FIG. 13, in the display apparatus 510 according to the current embodiment, the first display substrate 100 includes a first trench 190 and a second trench 192, so the sealing member 310 is between the first and second trenches 190 and 192. The first trench 190 is substantially identical to the trench 190 of FIG. 2. The second trench 192 has a substantially similar structure to the first trench 190. The second trench 192 may include a first sidewall 192_1 oriented along the direction D2 relative to a center of the second trench 192 and a second sidewall 192_2 oriented along the direction D1 relative to the center of the second trench 192.

A blocking film 185 covers a top surface of a stack of films (including the organic film 170) defined by the first trench 190 and the second trench 192. In addition, the blocking film 185 may extend toward the first trench 190 to cover the first sidewall 190_1 of the first trench 190 and extends toward the second trench 192 to cover the second sidewall 192_2 of the second trench 192. The sealing member 310 may be formed on the blocking film 185 to overlap the blocking film 185.

In the current embodiment, the second trench 192 is formed inside the sealed region S, and the blocking film 185 also covers the second sidewall 190_2 of the second trench 192. This can further inhibit the penetration of moisture or impurities into the sealed region S of the display apparatus 510, thus improving the stability and reliability of display quality.

Figure 14:
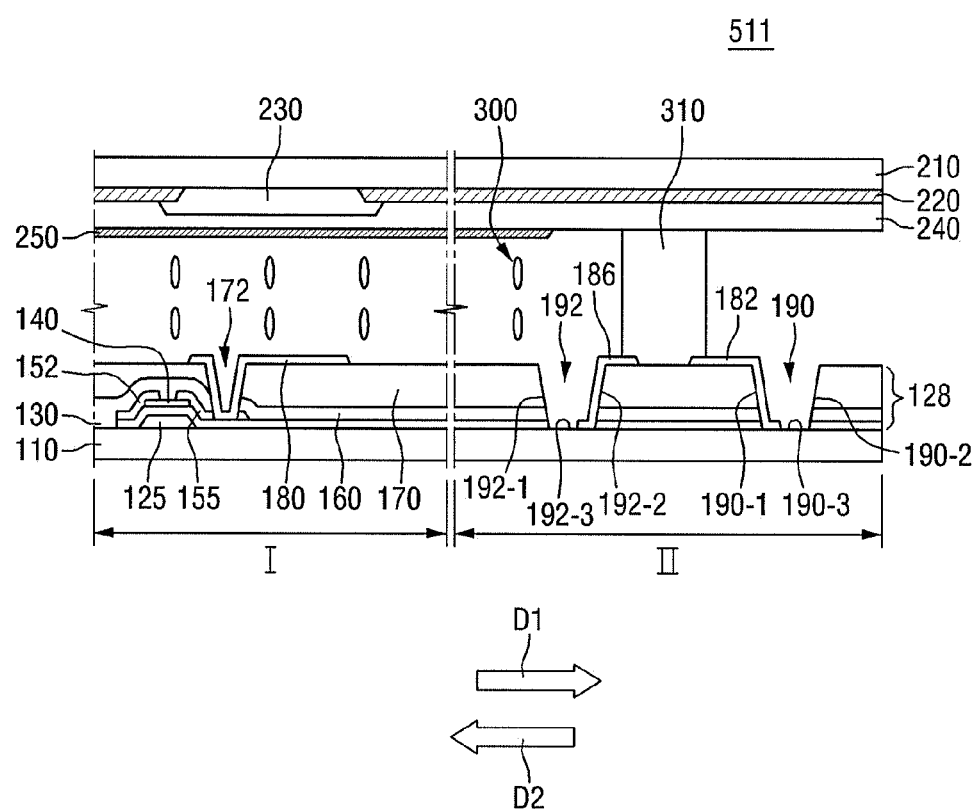

FIG. 14 is a cross-sectional view of a display apparatus 511 according to another embodiment. Referring to FIG. 14, the display apparatus 511 according to the current embodiment is different from the embodiment of FIG. 13 in that it includes a first blocking film 182 covering the first sidewall 190_1 of the first trench 190 and a second blocking film 186 covering the second sidewall 192_2 of the second trench 192. The first blocking film 182 and the second blocking film 186 extend onto a top surface of a stack of films (including the organic film 170) defined by the first trench 190 and the second trench 192 but are physically separated from each other. Therefore, they are not electrically connected to each other. An electric field may be applied to the second blocking film 186 by a signal wiring separate from the first blocking film 182.

Figure 15:
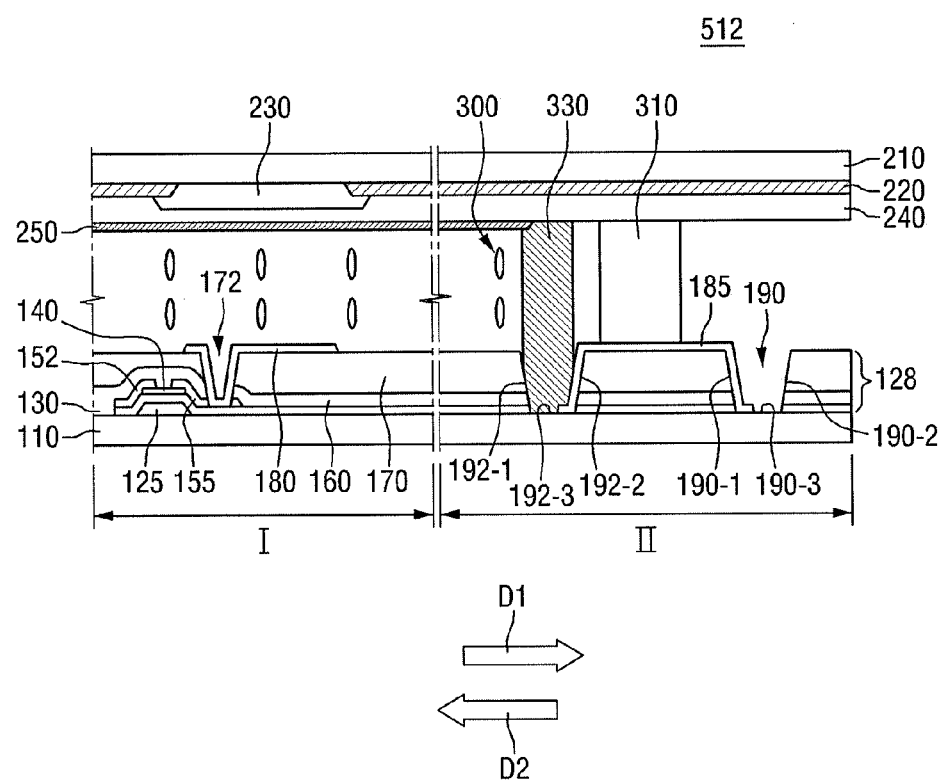

FIG. 15 is a cross-sectional view of a display apparatus 512 according to another embodiment. Referring to FIG. 15, the display apparatus 512 according to the current embodiment is different from the embodiment of FIG. 14 in that an inner spacer 330 is formed on the second trench 192. The inner spacer 330 may be substantially identical to the outer spacer 320 described above with reference to FIG. 12, except for its position. Therefore, since the inner spacer 330 blocks moisture or impurities introduced from the outside, the penetration of moisture or impurities into the display area I can further be prevented. Although not shown in the drawing, the embodiment of FIG. 15 may further include the outer spacer 320 of FIG. 12.

The above-described embodiments are all exemplary, and different embodiments can be combined. Embodiments of the example embodiments provide at least one of the following advantages.

Since penetration of moisture or impurities into an inner side of a display apparatus is inhibited, deterioration of pixels or liquid crystals can be prevented. Accordingly, this can improve the stability and reliability of display quality.

In contrast, while an inner side of a conventional display apparatus is protected by a sealing member, a region outside the sealing member is relatively easily exposed to the external environment. For example, if the organic film covering the wirings/electrodes on the first and/or second display substrates is exposed in the above outside region, moisture or impurities may penetrate into the inner side of the display apparatus through the organic film to deteriorate pixels or the liquid crystal layer.

However, the effects of the example embodiments are not restricted to the one set forth herein. The above and other effects of the example embodiments will become more apparent to one of daily skill in the art to which the example embodiments pertains by referencing the claims.

While the example embodiments has been particularly shown and described with reference to exemplary embodiments thereof, it will be understood by those of ordinary skill in the art that various changes in form and detail may be made therein without departing from the spirit and scope of the example embodiments as defined by the following claims. The exemplary embodiments should be considered in a descriptive sense only and not for purposes of limitation.

What is claimed is:

1. A display apparatus, comprising:
a first substrate having a display area and a non-display area surrounding the display area;
a second substrate separated from the first substrate and facing the first substrate;

a sealing member in the non-display area between the first substrate and the second substrate, the sealing member bonding the first substrate and the second substrate;

an organic film on the first substrate;

a first trench in the organic film in the non-display area, the first trench surrounding the display area and including a first sidewall on an inner side of the display apparatus, which includes a sidewall of the organic film, and a second sidewall on an outer side of the display apparatus, which includes a sidewall of the organic film; and a first blocking film containing an inorganic material and covering a surface of the organic film in the non-display area and the sidewall of the organic film included in the first sidewall of the first trench, wherein the sealing member is between the display area and the first trench, the sealing member and the first trench having a non-overlapping relationship and are spaced apart from each other.

2. The display apparatus of claim 1, wherein the first blocking film extends onto a bottom surface of the first trench.

3. The display apparatus of claim 2, wherein the first blocking film covers the sidewall of the organic film in the second sidewall of the first trench.

4. The display apparatus of claim 1, further comprising an insulating film between the first substrate and the organic film, the first trench exposing the insulating film, and each of the first sidewall and the second sidewall of the first trench further comprises a sidewall of the insulating film.

5. The display apparatus of claim 4, wherein the first blocking film covers the sidewall of the insulating film in the first sidewall of the first trench.

6. The display apparatus of claim 1, wherein:
the organic film includes an external portion extending in a space between the sealing member and the first trench, the external portion having a non-overlapping relationship with the sealing member, and
the first blocking film covers the external portion of the organic film between the sealing member and the first trench.

7. The display apparatus of claim 1, further comprising an outer spacer between the first substrate and the second substrate and overlapping the first trench.

8. The display apparatus of claim 1, further comprising:
an overcoating layer on the second substrate; and
an inorganic film on the overcoating layer and at least partially facing the first blocking film.

9. The display apparatus of claim 8, wherein the inorganic film is a common electrode.

10. The display apparatus of claim 8, wherein the inorganic film is separated from an extended plane from an adjacent sidewall of the second substrate.

11. The display apparatus of claim 1, further comprising a second trench in the organic film inside the sealing member in the non-display area, the second trench surrounding the display area and including a first sidewall, which is located on the inner side of the display apparatus and includes a sidewall of the organic film, and a second sidewall, which is located on the outer side of the display apparatus and includes a sidewall of the organic film.

12. The display apparatus of claim 11, wherein the first blocking film is extended to cover the second sidewall of the second trench.

13. The display apparatus of claim 11, further comprising a second blocking film including an inorganic material and covering the second sidewall of the second trench.

14. The display apparatus of claim 11, further comprising an inner spacer between the first substrate and the second substrate and overlapping the second trench.

15. The display apparatus of claim 1, wherein the first blocking film includes a conductive material.

16. The display apparatus of claim 15, further comprising a pixel electrode on the organic film in the display area, the first blocking film including the same material as the pixel electrode.

17. The display apparatus of claim 1, further comprising a second blocking film physically separated from the first blocking film, the second blocking film including an inorganic material and covering the sidewall of the organic film in the second sidewall of the first trench.

18. The display apparatus of claim 17, wherein the second blocking film extends to cover the organic film outside the first trench.

19. The display apparatus of claim 18, wherein the second blocking film is separated from an extended plane from an adjacent sidewall of the first substrate.

20. The display apparatus of claim 1, wherein:
the sealing member defines a sealed region between the first and second substrates,
the organic film includes an external portion extending beyond the sealing member and outside the sealed region, the external portion having a non-overlapping relationship with the sealing member and including a lateral surface defining at least a portion of the first sidewall of the first trench, and
the first blocking film covers an upper surface and the lateral surface of the external portion of the organic film.

21. A display apparatus, comprising:
a first substrate having a display area and a non-display area surrounding the display area;
a second substrate separated from the first substrate and facing the first substrate;
a sealing member in the non-display area between the first substrate and the second substrate, the sealing member bonding the first substrate and the second substrate and defining a sealed region therebetween;
an organic film on the first substrate, the organic film including an external portion extending beyond the sealing member and outside the sealed region;
a first trench in the organic film in the non-display area, the first trench surrounding the display area and including a first sidewall on an inner side of the display apparatus, which includes a sidewall of the organic film, and a second sidewall on an outer side of the display apparatus, which includes a sidewall of the organic film; and
a first blocking film containing an inorganic material and covering a surface of the organic film in the non-display area and the sidewall of the organic film included in the first sidewall of the first trench,
wherein the sealing member is between the display area and the first trench, the sealing member and the first trench having a non-overlapping relationship, and
wherein the external portion of the organic film has a non-overlapping relationship with the sealing member and includes a lateral surface defining at least a portion of the first sidewall of the first trench.

* * * * *